United States Patent
Veirman et al.

(10) Patent No.: US 11,359,305 B2
(45) Date of Patent: Jun. 14, 2022

(54) METHOD FOR VALIDATING THE THERMAL HISTORY OF A SEMICONDUCTOR INGOT

(71) Applicant: COMMISSARIAT A L'ENERGIE ATOMIQUE ET AUX ENERGIES ALTERNATIVES, Paris (FR)

(72) Inventors: Jordi Veirman, La Motte-Servolex (FR); Wilfried Favre, Chambery (FR); Elénore Letty, Brest (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/772,613

(22) PCT Filed: Dec. 12, 2018

(86) PCT No.: PCT/EP2018/084450
§ 371 (c)(1),
(2) Date: Jun. 12, 2020

(87) PCT Pub. No.: WO2019/115574
PCT Pub. Date: Jun. 20, 2019

(65) Prior Publication Data
US 2021/0079555 A1 Mar. 18, 2021

(30) Foreign Application Priority Data

Dec. 15, 2017 (FR) .................................... 1762282

(51) Int. Cl.
*C30B 15/20* (2006.01)
*C30B 29/06* (2006.01)
*G01N 27/04* (2006.01)

(52) U.S. Cl.
CPC ............ *C30B 15/206* (2013.01); *C30B 29/06* (2013.01); *G01N 27/041* (2013.01)

(58) Field of Classification Search
CPC ...... C30B 15/206; C30B 29/06; G01N 27/041
See application file for complete search history.

(56) References Cited

U.S. PATENT DOCUMENTS

2004/0112277 A1* 6/2004 Kulkarni ................. C30B 29/06
117/13
2009/0210166 A1* 8/2009 Nakamura ........... H01L 21/3225
702/23

FOREIGN PATENT DOCUMENTS

| FR | 2 964 459 A1 | 3/2012 |
| FR | 3 009 380 A1 | 2/2015 |
| FR | 3 045 074 A1 | 6/2017 |

OTHER PUBLICATIONS

International Search Report as issued in International Patent Application No. PCT/EP2018/084450, dated Jan. 24, 2019.

(Continued)

*Primary Examiner* — Matthew J Song
(74) *Attorney, Agent, or Firm* — Pillsbury Winthrop Shaw Pittman LLP

(57) ABSTRACT

An experimental method for validating a thermal history of a semiconductor ingot obtained by simulation of a crystallization process, includes a) measuring the concentration of interstitial oxygen in a portion of the semiconductor ingot; b) calculating a theoretical value of the concentration of thermal donors formed during the crystallization process, from the measurement of the concentration of interstitial oxygen and from the thermal history in the portion of the semiconductor ingot; c) measuring an experimental value of the concentration of thermal donors in the portion of the (Continued)

semiconductor ingot; and d) comparing the theoretical and experimental values of the concentration of thermal donors.

9 Claims, 1 Drawing Sheet

(56) References Cited

OTHER PUBLICATIONS

Veirman, J., et al., "A Fast and Easily Implemented Method for Interstitial Oxygen Concentration Mapping Through the Activation of Thermal Donors in Silicon," Energy Procedia, vol. 8, Apr. 2011, XP002717502, pp. 41-46.

Veirman, J., et al., "Thermal History Index as a bulk quality indicator for Czochralski solar wafers," Solar Energy Materials & Solar Cells, May 2016, XP055297084, 6 pages.

Dornberger, E., et al., "Thermal simulation of the Czochralski silicon growth process by three different models and comparison with experimental results," Journal of Crystal Growth 180, (1997), pp. 461-467.

Lee., Y. J., et al., "Simulation of the kinetics of oxygen complexes in crystalline silicon," Physical Review B 66, (2002), 11 pages.

Schindler, F., et al., "Towards a unified low-field model for carrier mobilities in crystalline silicon," Solar Energy Materials & Solar Cells 131, (2014), pp. 92-99.

Virzi, A., "Computer modelling of heat transfer in Czochralski silicon crystal growth," Journal of Crystal Growth 112, (1991), pp. 699-722.

Virzi, A., "Numerical study of Czochralski silicon full process thermokinetics," Modelling Simul. Mater. Sci. Eng. 1 (1993), pp. 693-706.

Wada, K., "Unified model for formation kinetics of oxygen thermal donors in silicon," Physical Review B, vol. 30, No. 10, Nov. 1984, pp. 5884-5895.

\* cited by examiner

METHOD FOR VALIDATING THE THERMAL HISTORY OF A SEMICONDUCTOR INGOT

CROSS-REFERENCE TO RELATED APPLICATIONS

This is the U.S. National Stage of PCT/EP2018/084450, filed Dec. 12, 2018, which in turn claims priority to French Application No. 1762282, filed Dec. 15, 2017, the entire contents of all applications are incorporated herein by reference in their entireties.

TECHNICAL FIELD

The present invention relates to semiconductor ingot crystallisation processes and more particularly relates to a method or process for experimentally validating the thermal history of a semiconductor ingot obtained by simulation of a crystallisation process.

PRIOR ART

High efficiency photovoltaic cells are for the most part manufactured from wafers derived from an ingot of Czochralski (Cz) monocrystalline silicon. Although reputed for its high electronic performances, notably in terms of lifetime of the charge carriers, CZ silicon is not exempt of defects and impurities. Oxygen constitutes the main impurity of CZ silicon and is in the form of atoms in interstitial positions in the crystalline lattice. Among the defects of CZ silicon, notably oxygen precipitates, oxygen vacancies and thermal donors may be cited. Thermal donors are agglomerates (based on oxygen) which form at temperatures comprised between 350° C. and 550° C. and which affect the electrical properties of the material by creating free electrons.

In order to optimise both the rate of production and the quality of CZ silicon ingots, ingot manufacturers resort to computer tools making it possible to simulate the Czochralski crystallisation process. Thanks to these simulations, it is for example possible to know the temperature in each portion of the ingot at a given instant of the crystallisation, as well as its evolution during crystallisation. This evolution, commonly called "thermal history", has a great influence on the quantity of defects formed during crystallisation in the considered portion of the ingot. The thermal history of the ingot varies as a function of numerous parameters, such as the relative height (also called "solidified fraction") at which is situated the considered portion of the ingot, the geometry and the materials of the parts that constitute the crystallisation furnace, the rate of pulling the ingot and the power delivered by the resistances of the furnace.

The thermal simulation of an ingot resorts to complex physical models. These models may lead to erroneous values of the thermal history if, for example, the calculation algorithm does not converge sufficiently or the definition of the grid is too low.

To ensure the relevance of the simulation results, and if need be to measure the degree of precision of the models, it is necessary to carry out an experimental validation by comparing the calculated thermal history with the measurements of the temperature of the ingot. It is however difficult to measure the thermal history of an ingot during manufacture, due to its rotation, its translational displacement and the very high temperatures which reign within the furnace (>1400° C.).

The document ["Thermal simulation of the Czochralski silicon grow process by three different models and comparison with experimental results", E. Dornberger et al., Journal of Crystal Growth 180, pp. 461-467, 1997] describes a method for experimentally validating the thermal history of an CZ silicon ingot. Several ingots of different lengths are firstly pulled following a given pulling recipe. Then, the ingots are equipped with thermocouples and mounted successively in a crystallisation furnace. Each ingot is placed in contact with a silicon melt after the furnace has reached a set temperature, at which the pulling of the ingot normally takes place. The temperature in the ingot is next measured by means of thermocouples after an equilibrium state has been reached.

This method for validating the thermal history is time-consuming because it requires pre-manufacturing, for each pulling recipe, ingots of different lengths (these lengths corresponding to different instants of the simulated crystallisation process). It is moreover not representative of the Czochralski crystallisation process, because the ingot is not rotationally driven during the step of measuring the temperatures (due to the cabling of the thermocouples). Finally, since no crystallisation takes place during the measurement step, the ingot does not dissipate the latent heat of solidification, which can greatly influence the temperatures measured in the ingot. The calculated thermal history and the temperature measurements are then difficult to compare.

SUMMARY OF THE INVENTION

There thus appears a need for a method that is simple and rapid to implement in order to validate (or invalidate) with certainty a thermal history of a semiconductor ingot, this thermal history having been obtained by simulation of a crystallisation process.

According to the invention, this need tends to be satisfied by providing a validation method comprising the following steps:
a) measuring the interstitial oxygen concentration in a portion of the semiconductor ingot;
b) calculating a theoretical value of the thermal donor concentration formed during the crystallisation process, from the measurement of the interstitial oxygen concentration and from the thermal history in the portion of the semiconductor ingot;
c) measuring an experimental value of the thermal donor concentration in the portion of the semiconductor ingot; and
d) comparing the theoretical and experimental values of the thermal donor concentration.

The thermal donors are oxygen-based defects which form between 350° C. and 500° C. during crystallisation and the concentration of which constitutes a marker of the thermal history of the ingot. Thus, rather than comparing directly the values of the temperature in the ingot, the validation method according to the invention carries out a comparison between of the theoretical and experimental values of the thermal donor concentration, the theoretical value of the thermal donor concentration being derived from the simulated thermal history. Unlike the method of the prior art, the validation method according to the invention does not require in situ measurements, i.e. inside the crystallisation furnace. The interstitial oxygen concentration and the thermal donor concentration may in fact be measured after the ingot has been extracted from the furnace, and thus much more simply than the temperature during crystallisation. The manufacture of the ingot is thus not impacted by the validation method according to the invention, which makes it possible to obtain results faithful to the crystallisation process employed.

In a preferential embodiment of the invention, the calculation of the theoretical value of the thermal donor concentration comprises the following operations:

establishing at least one empirical expression describing the thermal history (or representative of the thermal history) in the portion of the semiconductor ingot;

discretising into successive time steps the thermal history in the portion of the semiconductor ingot, by associating with each time step a temperature calculated using said at least one empirical expression;

calculating for each time step of which the associated temperature is comprised between 350° C. and 550° C. a content of thermal donors formed during said time step; and calculating the theoretical value of the thermal donor concentration from the contents of thermal donors formed during the successive time steps.

This mode of calculation makes it possible to determine with precision the thermal donor concentration formed during the crystallisation process (between 350° C. and 550° C.), while taking account of the exact temperature profile in the portion of the semiconductor ingot.

According to a development of this preferential embodiment, the calculation of the theoretical value of the thermal donor concentration is carried out by iterations and comprises, for each time step, the following operations:

summing the content of thermal donors formed during said time step and a content of thermal donors present in the semiconductor material at the preceding time step;

comparing said sum with a maximum thermal donor concentration at the temperature associated with said time step;

fixing a content of thermal donors present in the semiconductor material at said time step equal to said sum when this is less than the maximum thermal donor concentration; and fixing the content of thermal donors present in the semiconductor material at said time step equal to the maximum thermal donor concentration when said sum is greater than the maximum thermal donor concentration.

Preferably, the content $\Delta[DT]_n$ of thermal donors formed during said time step $\Delta T_n$ is calculated using the following relationship:

$$\Delta[DT]_n = \Delta T_n * a * D_i(T_n) * [O_i]^4 * m(T_n)^{-2}$$

where a is a constant, $T_n$ the temperature associated with said time step $\Delta T_n$, $D_i(T_n)$ the diffusion coefficient of oxygen at the temperature $T_n$ and $m(T_n)$ the concentration of free electrons at the temperature $T_n$.

The thermal history in the portion of the semiconductor ingot is advantageously described by means of two second degree polynomials.

Steps a) to d) of the validation method according to the invention may be accomplished for different portions distributed along the semiconductor ingot, in order to verify the thermal simulation of the whole of the ingot, and not only a portion. These different portions preferably comprise the upper end, called head, and the lower end, called tail, of the semiconductor ingot. Their number is advantageously greater than or equal to 5.

BRIEF DESCRIPTION OF THE FIGURES

Other characteristics and advantages of the invention will become clear from the description that is given thereof below, for indicative purposes and in no way limiting, with reference to the appended figures, among which.

For greater clarity, identical or similar elements are marked by identical reference signs in all of the figures.

DETAILED DESCRIPTION OF AT LEAST ONE EMBODIMENT

In the following description, "thermal history" designates the evolution of the temperature of a portion of a semiconductor ingot during crystallisation of the ingot. A portion preferably corresponds to a slice of the semiconductor ingot oriented perpendicularly to the longitudinal axis (or pulling axis) of the ingot and of which the thickness may be variable depending on its position in the ingot. The position of a portion or slice of the ingot is called "relative height" and is generally expressed as a percentage of the total height of the ingot.

Each of the portions of the ingot has a specific thermal history, which it is possible to calculate by simulation of the crystallisation process. All of these thermal histories make it possible to reconstitute the evolution of the temperature field in the semiconductor ingot.

The validation method described below makes it possible to know if the calculation of the thermal history for at least one portion of the semiconductor ingot is exact and, if need be, to know its degree of precision. Thanks to this information, it is next possible to optimise the crystallisation process by relying on thermal simulations, to refine the physical model used during these simulations to improve the precision of the calculation of the thermal history or, in the case of a manifestly erroneous thermal history, to modify the physical model in depth or even to change the model.

The semiconductor ingot is for example a monocrystalline silicon ingot obtained by the Czochralski crystallisation process (also called CZ silicon).

Figure 1:
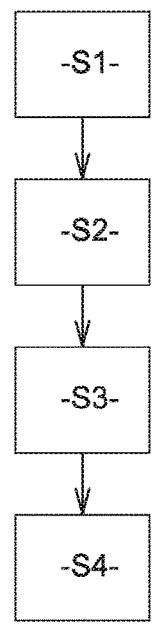
FIG. 1 represents steps S1 to S4 of a method for validating a thermal history according to the invention.

With reference to FIG. 1, the validation method firstly comprises a step S1 of measuring the interstitial oxygen concentration [Oi] in the portion of the ingot of which it is wished to validate the thermal history.

The measurement of the interstitial oxygen concentration [Oi] may be carried out at a point, for example by Fourier transform infrared spectroscopy (FTIR) on a thick wafer (typically between 1 mm and 2 mm thickness) sampled in the portion of the ingot and of which the surface has been polished.

In a particular embodiment of step S1, the interstitial oxygen concentration [Oi] is measured on the whole ingot, that is to say without prior cutting of wafers. The concentration [Oi] may be measured at the scale of the ingot by an infrared spectroscopy technique commonly called "Whole-rod FTIR". This technique, derived from Fourier transform infrared spectroscopy (FTIR), comprises the exposure of the portion of the ingot to an infrared beam. The absorption of the infrared beam by the portion of the ingot makes it possible to determine a interstitial oxygen concentration averaged over the diameter of the ingot.

Another technique, based on the formation of thermal donors, makes it possible to determine the concentration of oxygen $[O_i]$ in the CZ silicon. This technique has been described in detail in the patents FR2964459 and FR3009380 for the case of a silicon wafer. It may also be applied to the scale of the ingot. The content of the patents FR2964459 and FR3009380 is incorporated by reference in the present patent application.

The initial electrical resistivity is firstly measured in the portion of the ingot in order to determine the concentrations of acceptor and/or donor dopants. The ingot is next subjected to an annealing so as to create new thermal donors, different from those formed during crystallisation. The temperature of this annealing is preferably constant and comprised between 350° C. and 550° C. Then, the electrical resistivity after annealing is measured in the same zone of the ingot. From this second resistivity value and from the concentrations of dopants, it is possible to calculate the concentration of thermal donors formed by the annealing. Finally, the interstitial oxygen concentration [Oi] in the portion of the ingot is determined from the concentration of thermal donors newly created and from the duration of the annealing between 350° C. and 550° C., for example by means of an abacus.

This latter technique is precise and particularly simple to implement. It is advantageous even when it is applied to a wafer taken in the ingot because, unlike the FTIR technique, it does not require polishing of the wafer and is not limited in terms of thickness.

The validation method of FIG. 1 next comprises a step S2 making it possible to determine a theoretical value $[DT]_{th}$ of the concentration of thermal donors formed in the portion of the ingot, during crystallisation. This theoretical value $[DT]_{th}$ is calculated from the thermal history of the portion of the ingot and from the interstitial oxygen concentration [Oi] measured at step S1, using a mathematical model that describes the kinetics of formation of the thermal donors.

In a preferential embodiment of the validation method, the calculation of the thermal donor concentration $[DT]_{th}$ is composed of the following operations.

Firstly, the thermal history of the portion of the ingot, represented graphically be a curve of the temperature T as a function of the duration of crystallisation t, is described analytically using one or more empirical expressions. This first operation, called fitting, consists in determining at least one function T(t) of which the curve reproduces the simulated thermal history (i.e. the temperature profile).

The empirical expressions describing or representing the thermal history are advantageously chosen from n degree polynomials (n being a non-zero natural number), because the polynomial functions enable a precise fit of the curves of thermal history of a semiconductor ingot.

To improve the precision of the calculation of the thermal donor concentration, it is preferable that the thermal history curve comprises a high number of points, for example between 300 and 600 points distributed over a wide range of temperatures (typically from 1400° C. to 200° C.) of which at least 20 points are situated in the range of temperatures 350° C.-550° C.

Figure 2:
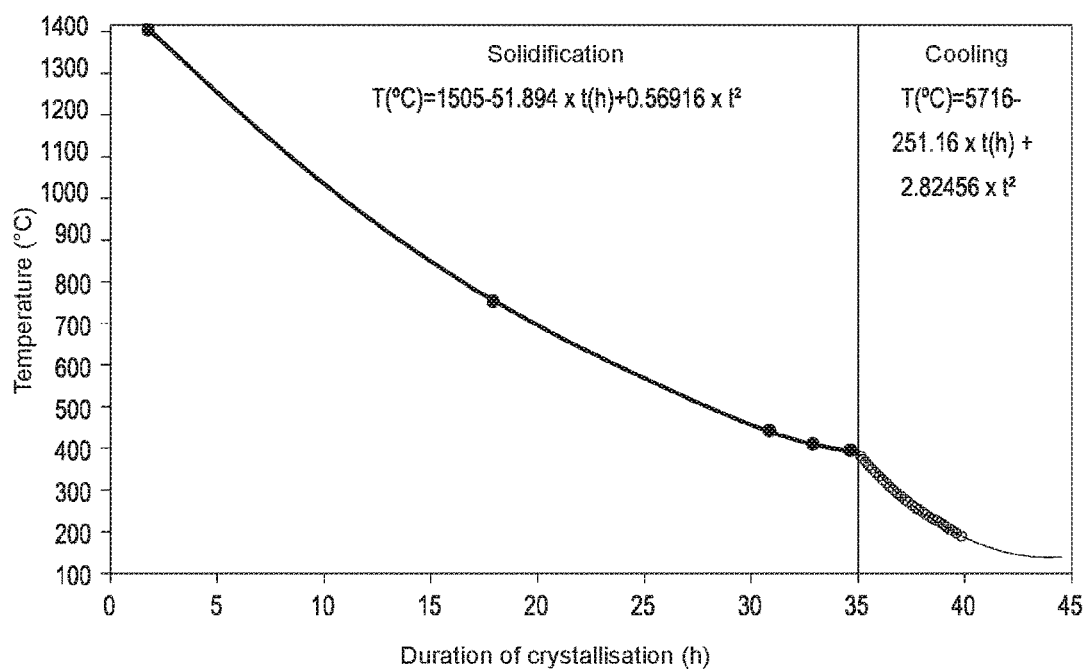
FIG. 2 shows an example of thermal history of a portion of semiconductor ingot, obtained by simulation of the ingot crystallisation process, as well as the results of the step of fitting this thermal history by two polynomial functions.

FIG. 2 shows as an example the thermal history of a portion of an CZ silicon ingot situated at a relative height of 1%. This example of thermal history was obtained by simulation of the Czochralski crystallisation process, using the ANSYS® Fluent® simulation tool. This makes it possible to distinguish two successive phases of the Czochralski process: the phase of solidification of the ingot and the phase of cooling of the ingot. The end of the solidification phase, at t~35 h on the graph of FIG. 2, is marked by the removal of the ingot from the silicon melt. The start of the cooling phase is marked by a more rapid reduction in the temperature.

The thermal history is here described by means of two second degree polynomials ($T(t)=A*t^2+B*t+C$, with A, B and C constant fitting parameters), one for the solidification phase, the other for the cooling phase. The use of two second degree polynomials makes it possible to limit the calculation time and means necessary for the fitting operation and proves to be particularly suited to this type of thermal history in two parts.

The second operation of calculation of the theoretical value $[DT]_{th}$ is a discretisation of the thermal history into successive time steps $\Delta t_n$. This discretisation may be carried out for example using a spreadsheet, by associating with each time step $\Delta t_n$ a temperature value $T_n$ calculated using the empirical expression determined during the preceding operation. The duration of the time steps $\Delta t_n$ is mainly chosen as a function of the length of the ingot and the pulling rate during the crystallisation process. It is preferably less than 10 min, for example equal to 1 min.

When the thermal history is described by several expressions, each calculation of the temperature $T_n$ is carried out with the empirical expression associated with the considered time step $\Delta t_n$. In the example of FIG. 2, the first polynomial (corresponding to the solidification phase) is used for the $35*60/\Delta t_n$ (min) first time steps and the second polynomial is used for all the following time steps.

Next, at least for each time step $\Delta t_n$ of which the associated temperature $T_n$ is comprised between 350° C. and 550° C., a content (i.e. concentration) $\Delta[DT]_n$ of thermal donors formed during the time step $\Delta t_n$ is calculated. The content $\Delta[DT]_n$ of thermal donors is preferably calculated using the following relationship:

$$\Delta[DT]_n = \Delta T_n * a * D_i(T_n) * [O_i]^4 * m(T_n)^{-2} \quad (1)$$

where a is a constant, $T_n$ the temperature associated with the time step $\Delta T_n$, $D_i(T_n)$ the diffusion coefficient of oxygen at the temperature $T_n$ and $m(T_n)$ the concentration of free electrons at the temperature $T_n$.

This relationship (1) is taken from an article entitled ["Unified model for formation kinetics of oxygen thermal donors in Silicon", K. Wada, Physical Review B, Vol. 30, N. 10, 20 pp. 5885-5895, 1984], which describes a model for calculating the formation kinetics of thermal donors in CZ silicon at a constant temperature, for example 450° C. This document, the content of which is incorporated here as a reference, also provides the values of the parameters of the relationship (1) or the formulas making it possible to calculate them, with the exception of the effective mass of the holes. The latter is, according to the literature, equal to 0.81 for silicon.

The discretisation into time steps makes the use of the Wada model possible, because it provides a constant temperature $T_n$ for each time step.

In practice, the content $\Delta[DT]_n$ of thermal donors may be calculated for all the time steps of the simulated thermal history, for example from 1414° C. to ambient temperature (i.e. 25° C.), but the contribution of temperatures outside of the range 350° C.-550° C. on the formation of thermal donors is negligible.

Finally, during a final operation, the theoretical value $[DT]t_n$ of the concentration of theoretical donors is calculated from the contents $\Delta[DT]_n$ of thermal donors during the different time steps.

In a simplified embodiment of step S2, the sum of all the calculated contents $\Delta[DT]_n$ constitutes the theoretical value $[DT]t_n$ of the concentration of thermal donors formed during crystallisation:

$$[DT]_{th} = \Sigma \Delta[DT]_n$$

However, according to the aforementioned article, the concentration of thermal donors in the ingot at a given temperature cannot exceed a maximum concentration $[DT]_{max}$ of thermal donors. In other words, there exists a "solubility" limit of thermal donors in CZ silicon, which depends on the temperature. This maximum concentration is written in the following manner:

$$[DT]_{max}(T_n) = \frac{a}{b} * [Oi]^3 * m(T_n)^{-2} \quad (2)$$

where b is another constant provided by the Wada article.

Thus, in a particular embodiment of step S2, the calculation of the theoretical value $[DT]_{th}$ of the thermal donor concentration is carried out by iterations, taking into account at each iteration the maximum concentration $[DT]_{max}$ of thermal donors.

For each time step $\Delta t_n$, the content $\Delta[DT]_n$ of thermal donors formed during the time step $\Delta t_n$ is added to the content of thermal donors present in the semiconductor material at the preceding time step, noted $[DT]_{n-1}$. Then, this sum is compared with the maximum concentration $[DT]_{max}$ of thermal donors at the temperature $T_n$ (associated with the considered time step $\Delta t_n$). If the sum $[DT]_{n-1}+\Delta[DT]_n$ is greater than the maximum concentration $[DT]_{max}$, then the content of thermal donors at the time step $\Delta t_n$ is considered as equal to the maximum concentration $[DT]_{max}$ of thermal donors (at the temperature $T_n$):

$$[DT]_n = [DT]_{max}(T_n)$$

If conversely the sum $[DT]_{n-1}+\Delta[DT]_n$ is less than the maximum concentration $[DT]_{max}$, then this sum becomes the content of thermal donors present in the material at the time step $\Delta t_n$, i.e.:

$$[DT]_n = [DT]_{n-1} + \Delta[DT]_n$$

This is done for all the time steps (at least those for which the associated temperature $T_n$ is comprised between 350° C. and 550° C.) and the theoretical value $[DT]t_n$ of the thermal donor concentration is equal to the content of thermal donors of the material at the final time step. The initial content of thermal donors of the material (i.e. before the first time step) is assumed zero ($[DT]_0=0$).

This calculation alternative procures more precision on the calculation of the theoretical value $[DT]_{th}$ of the thermal donor concentration.

The Wada model is not the only model describing the formation kinetics of thermal donors and making it possible to calculate the theoretical value $[DT]_{th}$ of the concentration of thermal donors formed during crystallisation. The model of Y. J. Lee et al., described in the article ["Simulation of the kinetics of oxygen complexes in crystalline silicon", Physical Review B, Vol. 66, 20165221, 2002], may notably be cited.

The equation of the model of Y. J. Lee et al., which gives the content $\Delta[DT]_n$ of thermal donors for each time step, is the following:

$$\Delta[DT]_n = \sum_{k=0}^{16} \int_0^{\Delta T_n} \frac{d[O_k]}{dt} dt$$

where $[O_k]$ corresponds to the concentration of thermal donors of the family k (0<k<16) and of which the temporal derivative is written:

$$\frac{d[O_k]}{dt} = \sum_{j=1}^{k-1} (k_a^{j,k-j}[O_j][O_{k-j}] - k_d^{j,k-j}[O_k]) +$$

$$\sum_{l=1} (1 + \delta_{kl})(-k_a^{k,l}[O_k][O_l] + k_d^{k,l}[O_{k+l}])$$

$k_a^{j,k-j}$ and $k_d^{j,k-j}$ are association and dissociation constants for the reaction of $[O_j]$ and $[O_{k-j}]$ into $[O_k]$, the expressions of which are provided by the article of Lee et al. $\delta_{kj}$ the Kronecker delta and makes it possible to avoid counting a same reaction twice.

According to the experiments carried out by the Applicant, it appears that the Wada model tends to overestimate the kinetics of formation of thermal donors compared to other more precise models. In order to take account of this tendency, the contents $\Delta[DT]_n$ of thermal donors calculated at step S2 are advantageously multiplied by a reduction coefficient, for example 0.75. This weighting of the contents $\Delta[DT]_n$ greatly improves the precision of the calculation of the theoretical value $[DT]_{th}$.

For the same reason, when the interstitial oxygen concentration [Oi] is measured by FTIR or an alternative thereof at the ingot scale at step S1 of the method, it is preferable to choose the same measurement norm as that used in the selected model of formation of thermal donors. If not, a weighting coefficient is advantageously applied to the measurement of the interstitial oxygen concentration [Oi] before it is used as input for the Wada model. For example, if the measurement technique obeys the FTIR norm recommended by SEMI with a calibration coefficient of 6.28 ppma·cm, the measured value of the interstitial oxygen concentration [Oi] is multiplied by 5.5/6.28, because the Wada model uses a calibration coefficient of around 5.5 ppma·cm. If the Lee model (calibration coefficient of 6.28 ppma·cm) is employed and if the interstitial oxygen concentration [Oi] is measured with the FTIR SEMI norm, no weighting coefficient is used.

Step S3 of the validation method (cf. FIG. 1) consists in determining an experimental value $[DT]_{exp}$ of the concentration of thermal donors formed during crystallisation of the ingot.

The experimental value $[DT]_{exp}$ of the thermal donor concentration may be obtained from the variation in resistivity or from the variation in the concentration of charge carriers, caused by annealing at high temperature (>600° C.). This annealing at high temperature (typically 30 minutes at 650° C.) makes it possible to destroy the thermal donors formed during the crystallisation of the ingot. The electrical resistivity may be measured (before and after the destruction annealing) by the four points method, the Van der Pauw method or be derived from the measurement of the Foucault current. This measurement technique is described in detail in the patent FR3009380, the content of which is incorporated by reference. The concentration of charge carriers may be measured by Hall effect or deduced from C-V measurements.

The ingot is preferably doped in such a way as to have an initial resistivity (i.e. after crystallisation and before any thermal treatment) greater than 1 Ω·cm, such that the variation in resistivity before-after destruction annealing of the thermal donors is detectable with precision.

Step S3 may be implemented after step S1 even when the technique of patents FR2964459 and FR3009380 is used to measure the interstitial oxygen concentration [Oi]. It suffices in this case to consider the initial electrical resistivity (or the concentration of charge carriers) of the ingot. Step S3 may also be implemented before step S1, in which case there are no more thermal donors at the moment of carrying out the annealing between 350° C. and 550° C.

In other words, the validation method is not limited to any order of steps S1 and S3. The patent FR3009380 gives more details on the manner of articulating step S1 of measuring the interstitial oxygen concentration [Oi] and step S3 of measuring the thermal donor concentration $[DT]_{exp}$.

Steps S1 and S3 may be accomplished by a same item of equipment, for example the "OxyMap" equipment sold by the "AET Solar Tech" Company.

Finally, at step S4 of FIG. 1, the theoretical value $[DT]_{th}$ and the experimental value $[DT]_{exp}$ of the thermal donor concentration are compared. If the theoretical value $[DT]_{th}$ is close to the experimental value $[DT]_{exp}$, typically comprised between $0.7*[DT]_{exp}$ and $1.3*[DT]_{exp}$, the thermal history of the portion of the ingot is considered as valid. If conversely the theoretical value $[DT]_{th}$ is far from the experimental value $[DT]_{exp}$, typically $1.3*[DT]_{exp}$, or $0.7*[DT]_{exp}$, then the thermal history of the portion of the ingot is not validated.

Since the measurements of the oxygen concentration and the thermal donor concentration $[DT]_{exp}$ are carried out after crystallisation of the ingot, the validation method described above is quicker and simpler to implement than the method of the prior art. The results obtained are moreover faithful to the crystallisation method employed, the Czochralski process in this example, because the validation method does not interfere with the crystallisation of the ingot.

Preferably, steps S1 to S4 of FIG. 2 are accomplished for different portions distributed along the ingot (along the longitudinal axis of the ingot), in order to verify the validity of the thermal simulation in its globality. The thermal simulation is considered as right after the thermal history of each of the selected portions has been validated at step S4 of the method.

The number of different portions of the ingot is preferably greater than or equal to 5. They advantageously comprise the upper end and the lower end, called respectively "head" and "tail", because their respective thermal histories are very different. The interstitial oxygen concentration $[O_i]$ and the thermal donor concentration $[DT]_{exp}$ are preferably measured at the same place in the different portions, for example on an edge or at the centre of the slices derived from the ingot.

Although the validation method has been described in relation with an ingot made of monocrystalline CZ silicon, it could be applied to other crystallisation methods and/or semiconductor materials (monocrystalline or polycrystalline), from the moment that said material contains oxygen. Germanium and silicon-germanium alloy are potential candidates, because oxygen based thermal donors are also formed during the crystallisation thereof.

The invention claimed is:

1. An experimental method for validating a thermal history of a semiconductor ingot, the method comprising:
   simulating a crystallisation process to obtain the thermal history of the semiconductor ingot;
   measuring an interstitial oxygen concentration in a portion of the semiconductor ingot;
   calculating a theoretical value of the thermal donor concentration formed during the crystallisation process, from the measurement of the interstitial oxygen concentration and from the thermal history in the portion of the semiconductor ingot;
   measuring an experimental value of the thermal donor concentration in the portion of the semiconductor ingot;
   comparing the theoretical and experimental values of the thermal donor concentration,
   determining whether the theoretical value of the thermal donor concentration is comprised between $0.7*[DT]_{exp}$ and $1.3*[DT]_{exp}$ so to validate the thermal history of the semiconductor ingot, where $[DT]_{exp}$ is the experimental value of the thermal donor concentration.

2. The method according to claim 1, wherein the calculation of the theoretical value of the thermal donor concentration comprises the following operations:
   establishing at least one empirical expression describing the thermal history in the portion of the semiconductor ingot;
   discretising into successive time steps the thermal history in the portion of the semiconductor ingot, by associating with each time step a temperature calculated using said at least one empirical expression;
   calculating, for each time step of which the associated temperature is comprised between 350° C. and 550° C., a theorical content of thermal donors formed during said time step; and
   calculating the theoretical value of the thermal donor concentration from the theoretical contents of thermal donors formed during the successive time steps.

3. The method according to claim 2, wherein the calculation of the theoretical value of the thermal donor concentration is carried out by iterations and comprises, for each time step, the following operations:
   summing the theorical content of thermal donors formed during said time step and a theorical content of thermal donors present in the semiconductor material at the preceding time step to obtain a sum;
   comparing said sum with a theorical maximum thermal donor concentration at the temperature associated with said time step;
   fixing a theorical content of thermal donors present in the semiconductor material at said time step equal to said sum when it is below the theorical maximum thermal donor concentration; and
   fixing the theoretical content of thermal donors present in the semiconductor material at said time step equal to the theorical maximum thermal donor concentration when said sum is greater than the theorical maximum thermal donor concentration.

4. The method according to claim 2, wherein the theorical content $\Delta[DT]_n$ of thermal donors formed during said time step $\Delta T_n$ is calculated by means of the following relationship:

$$\Delta[DT]_n = \Delta T_n * a * D_i(T_n) * [O_i]^4 * m(T_n)^{-2}$$

where a is a constant, $T_n$ the temperature associated with said time step $\Delta T_n$, $D_i(T_n)$ the diffusion coefficient of oxygen at the temperature $T_n$ and $m(T_n)$ the concentration of free electrons at the temperature $T_n$, wherein a is 2.8 $10^{-10}$ cm$^4$.

5. The method according to claim 2, wherein the thermal history is represented by a curve of the temperature as a function of a duration of crystallisation and wherein establishing the at least one empirical expression comprises fitting said curve with two second degree polynomials.

6. The method according to claim 1, wherein steps a) to d) are accomplished for different portions distributed along the semiconductor ingot.

7. The method according to claim 6, wherein the different portions comprise the upper end, called head, and the lower end, called tail, of the semiconductor ingot.

8. The method according to claim 6, wherein the number of different portions is greater than or equal to 5.

9. An experimental method for validating a thermal history of a semiconductor ingot obtained by simulation of a crystallisation process, the method comprising:
- measuring an interstitial oxygen concentration in a portion of the semiconductor ingot;
- calculating a theoretical value of the thermal donor concentration formed during the crystallisation process, from the measurement of the interstitial oxygen concentration and from the thermal history in the portion of the semiconductor ingot;
- measuring an experimental value of the thermal donor concentration in the portion of the semiconductor ingot; and
- comparing the theoretical and experimental values of the thermal donor concentration;

wherein the calculation of the theoretical value of the thermal donor concentration comprises the following operations:
- establishing at least one empirical expression describing the thermal history in the portion of the semiconductor ingot;
- discretising into successive time steps the thermal history in the portion of the semiconductor ingot, by associating with each time step a temperature calculated using said at least one empirical expression;
- calculating, for each time step of which the associated temperature is comprised between 350° C. and 550° C., a theorical content of thermal donors formed during said time step; and
- calculating the theoretical value of the thermal donor concentration from the theorical contents of thermal donors formed during the successive time steps.

* * * * *